United States Patent
Lee

(10) Patent No.: US 9,205,755 B2
(45) Date of Patent: Dec. 8, 2015

(54) RECEDING HORIZON REGRESSION ANALYSIS FOR BATTERY IMPEDANCE PARAMETER ESTIMATION

(71) Applicant: Ford Global Technologies, LLC, Dearborn, MI (US)

(72) Inventor: Tae-Kyung Lee, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 13 days.

(21) Appl. No.: 14/154,802

(22) Filed: Jan. 14, 2014

(65) Prior Publication Data

US 2015/0197164 A1    Jul. 16, 2015

(51) Int. Cl.
*B60L 9/00*    (2006.01)
*B60L 11/18*    (2006.01)

(52) U.S. Cl.
CPC .................................. *B60L 11/1864* (2013.01)

(58) Field of Classification Search
None
See application file for complete search history.

(56) References Cited

U.S. PATENT DOCUMENTS

| | | | |
|---|---|---|---|
| 6,874,591 B2 | 4/2005 | Morrell et al. | |
| 8,055,460 B2 | 11/2011 | Rajagopalan et al. | |
| 8,170,818 B2 | 5/2012 | Lin et al. | |
| 2011/0066308 A1 | 3/2011 | Yang et al. | |
| 2012/0028106 A1* | 2/2012 | Saruwatari et al. | 429/156 |
| 2012/0319470 A1* | 12/2012 | Oberti et al. | 307/9.1 |

\* cited by examiner

*Primary Examiner* — Adam Alharbi
(74) *Attorney, Agent, or Firm* — David B. Kelley; Brooks Kushman P.C.

(57) ABSTRACT

A hybrid vehicle includes a battery pack having one or more cells and a controller configured to continuously update battery model parameter values based on generalized linear regression analysis. The analysis updates the parameters using a dataset of independent variable vectors and a dependent variable vector constructed from a series of input currents to the battery pack and corresponding voltage responses of the battery pack that fall within a moving window.

15 Claims, 5 Drawing Sheets to function. In a typical vehicle, the low voltage systems are electrically connected to a 12V battery 20. An all-electric vehicle may have a similar architecture but without the engine 8.

RECEDING HORIZON REGRESSION ANALYSIS FOR BATTERY IMPEDANCE PARAMETER ESTIMATION

TECHNICAL FIELD

The present disclosure relates to techniques for estimating parameters of elements forming a battery model and providing control to an associated battery.

BACKGROUND

Hybrid electric vehicles (HEV) utilize a combination of an internal combustion engine with an electric motor to provide the power needed to propel a vehicle. This arrangement provides improved fuel economy over a vehicle that has only an internal combustion engine. One method of improving the fuel economy in an HEV includes shutting down the engine during times that the engine operates inefficiently, and is not otherwise needed to propel the vehicle. In these situations, the electric motor coupled with a battery system is used to provide all of the power needed to propel the vehicle. When the driver power demand increases such that the electric motor can no longer provide enough power to meet the demand, or in other cases such as when the battery state of charge (SOC) drops below a certain level, the engine should start quickly and smoothly in a manner that is nearly transparent to the driver.

SUMMARY

A battery system includes a battery pack having one or more cells and a controller configured to update battery model parameter values used for providing control of the battery pack. The system may include one or more equivalent circuits configured to model the battery pack using generalized linear regression analysis. The generalized linear regression analysis is performed using a dataset of independent variable vectors and a dependent variable vector constructed from a series of input currents to the battery pack and corresponding voltage responses of the battery pack that fall within a sliding window.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

An HEV battery system may implement a battery management strategy that estimates values descriptive of the present operating condition of the battery pack and/or one or more battery cells. The battery pack and/or one or more battery cells operating conditions include battery state of charge, power fade, capacity fade, and instantaneous available power. The battery management strategy may be capable of estimating values as cells age over the lifetime of the pack. The precise estimation of some parameters and the improved battery dynamics prediction using the estimated parameters may improve performance and robustness of the battery pack, and may ultimately lengthen the useful lifetime of the battery pack. For the battery system described herein, estimation of some battery pack and/or cell parameters can be realized as discussed below.

Figure 1:
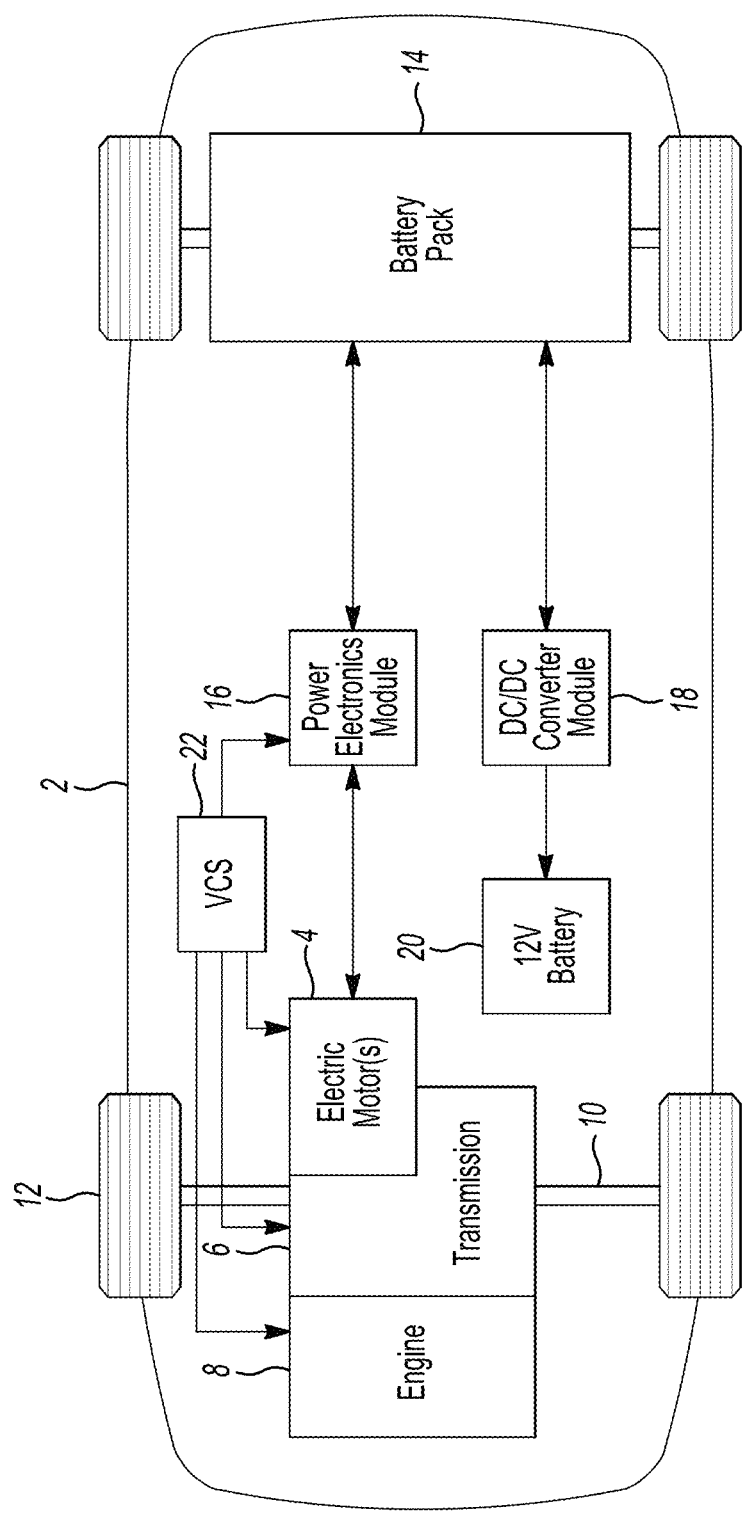
FIG. 1 is a schematic diagram of a hybrid-electric vehicle illustrating typical drivetrain and energy storage components.

FIG. 1 depicts a typical hybrid-electric vehicle. A typical hybrid-electric vehicle 2 may comprise one or more electric motors 4 mechanically connected to a hybrid transmission 6. In addition, the hybrid transmission 6 is mechanically connected to an engine 8. The hybrid transmission 6 is also mechanically connected to a drive shaft 10 that is mechanically connected to the wheels 12. In another embodiment not depicted in the illustration, the hybrid transmission may be a non-selectable gear transmission that may include at least one electric machine. The electric motors 4 can provide propulsion and deceleration capability when the engine 8 is turned on or off. The electric motors 4 also act as generators and can provide fuel economy benefits by recovering energy that would normally be lost as heat in the friction braking system. The electric motors 4 may also provide reduced pollutant emissions since the hybrid electric vehicle 2 may be operated in electric mode under certain conditions.

A battery pack 14 may include, but is not limited to, a traction battery having one or more battery cells that store energy which can be used by the electric motors 4. The vehicle battery pack 14 typically provides a high voltage DC output and is electrically connected to a power electronics module 16. The power electronics module 16 may communicate with one or more control modules that make up a vehicle computing system 22. The vehicle computing system 22 may control several vehicle features, systems, and/or subsystems. The one or more modules may include, but are not limited to, a battery management system. The power electronics module 16 is also electrically connected to the electric motors 4 and provides the ability to bi-directionally transfer energy between the battery pack 14 and the electric motors 4. For example, a typical battery pack 14 may provide a DC voltage while the electric motors 4 may require three-phase AC current to function. The power electronics module 16 may convert the DC voltage to a three-phase AC current as required by the electric motors 4. In a regenerative mode, the power electronics module 16 will convert the three-phase AC current from the electric motors 4 acting as generators to the DC voltage required by the battery pack 14.

In addition to providing energy for propulsion, the battery pack 14 may provide energy for other vehicle electrical systems. A typical system may include a DC/DC converter module 18 that converts the high voltage DC output of the battery pack 14 to a low voltage DC supply that is compatible with other vehicle loads. Other high voltage loads may be connected directly without the use of a DC/DC converter module 18. In a typical vehicle, the low voltage systems are electrically connected to a 12V battery 20.

The battery pack 14 may be controlled by the power electronics module 16 which may receive commands from a vehicle computing system 22 having one or more control modules. The one or more control modules may include, but are not limited to, a battery control module. The one or more control modules may be calibrated to control the battery pack 14 using a battery model parameter estimation method which estimates an average sense of effective battery internal resistance during operation to determine battery power capability. The power capability prediction enables the battery pack 14 to prevent over-charging and over-discharging which could lead to reducing the life of the battery, performance issues with the vehicle powertrain, etc.

The battery parameter prediction method and/or strategy may assist in determining battery current limits and power capability in real-time (i.e., during operation). Many battery parameter estimation processes are affected by the fidelity of battery models and unpredicted environmental conditions or unexpected noises during battery operations. For example, if a battery is in a charge depleting mode, a simple battery model may not capture complicated system dynamics associated with voltage output and current input they are trying to measure. The vehicle battery measurement method/strategy may use the equivalent circuit model using one or more resistant-capacitor (R-C) circuits in several configurations to measure the battery pack in the vehicle to obtain the electrochemical impedance during operation.

Figure 2:
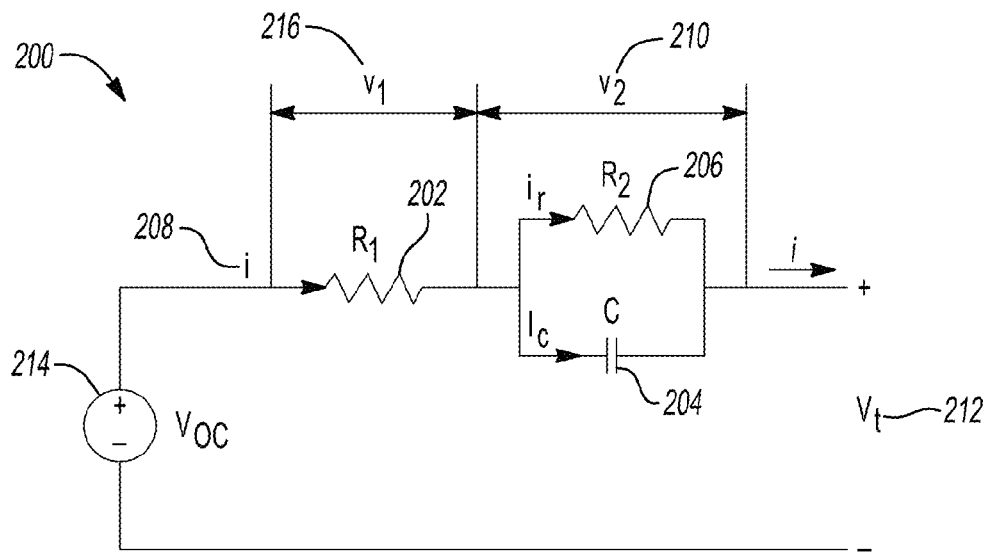
FIG. 2 is a schematic diagram of an equivalent circuit for a Li-ion battery.

FIG. 2 is a schematic diagram of a simple equivalent circuit modeling a battery. The circuit may model a battery including a battery pack and/or one or more battery cells. The simple equivalent circuit model 200 may include a Randles Circuit Model and/or one or more R-C circuits. The Randles circuit (e.g., an R-C circuit) consists of an active electrolyte resistance $R_1$ 202 in series with a parallel capacitance C 204 and active charge transfer resistance $R_2$ 206. The Randles circuit allows the measurement of $v_t$ 212 terminal voltage, $v_{OC}$ 214 battery open circuit voltage, $v_1$ 216 internal battery voltage, and $v_2$ 210 the voltage of the R-C circuit. The Randles circuit may be implemented in a HEV battery management system to provide predictive computations for one or more battery parameters.

The HEV battery management system may implement the Randles Circuit Model to predict battery dynamic responses, such as battery terminal voltage responses with respect to the electric current inputs to the battery pack. The Randles Circuit Model can facilitate speedy computations manageable by the battery management system without introducing additional hardware and/or increasing the system complexity. The equivalent circuit model 200 may allow the calculation of predictive battery system parameters including, but not limited to, impedance of the battery pack, internal resistance, and its correlating dynamics. The measurement values may be recorded, calculated, and stored in one or more control modules in the vehicle computing system including the battery energy control module.

The model parameters in the Randles Circuit Model may be estimated from the measurements of battery inputs and outputs based on various algorithms. Battery power capability may be predicted from the battery model with estimated model parameters representing Ohmic behavior, charge-transfer dynamics, and diffusion dynamics during vehicle operation (e.g., real time operation). Battery power capability may be affected by the battery present state and its correlating dynamics. The power capability of a battery may be determined by measuring internal states and may be inferred by using external system outputs which may be subject to system noise during battery operation. The power capability calculations for the battery system may be improved by applying a receding horizon to the battery measurements to cause the estimated parameter(s) to be less sensitive to the system noise.

The real-time battery model parameter estimation algorithm may be designed to obtain estimated model parameters less sensitive to model inaccuracy and sensor noises by combining a generalized linear regression analysis with a receding horizon approach (or, a moving window approach). The Randles Circuit Model is represented by the following equation:

$$\dot{v}_2 = -\frac{1}{R_2 C} v_2 + \frac{1}{C} i \tag{1}$$

where equation (1) is discretized to be applied to a moving window using the following equation:

$$\dot{v}_2 = \frac{v_{2,k} - v_{2,k-1}}{\Delta t} \tag{2}$$

The discrete form of equation (1) is derived based on equation (2) in the following equation:

$$v_{2,k} = \left(1 - \frac{\Delta t}{R_2 C}\right) v_{2,k-1} + \frac{\Delta t}{C} i_{k-1} = a v_{2,k-1} + b i_{k-1} \tag{3}$$

where $v_{2,k}$ 210 is the voltage across the R-C circuit in the simplified Randles Circuit Model at the present time step $t=t_k$, $v_{2,k-1}$ is the voltage across the R-C circuit in the simplified Randles Circuit Model at the previous time step $t=t_{k-1}$, $\Delta t$ is the duration of a time step, and $i_{k-1}$ is the input current at the previous time step $t=t_{k-1}$. An alternative way to realize equation (3) is to replace the input current $i_{k-1}$ at the previous time step by the input current $i_k$ at the current time step.

As formulated in equation (3), a new model parameter a is defined in the following equation:

$$a = 1 - \frac{\Delta t}{R_2 C} \tag{4}$$

and, another model parameter b is defined in the following equation:

$$b = \frac{\Delta t}{C} \tag{5}$$

The battery response representing battery dynamics is defined as the following equation:

$$y_k = v_{OC,k} - v_{t,k} = v_{2,k} + R_1 i_k \tag{6}$$

where $y_k$ is the battery voltage response representing battery dynamics at a given battery state-of-charge (SOC), $v_{OC,k}$ is the open circuit voltage at a present time step $t=t_k$, and $V_{t,k}$ is the terminal voltage measured at the battery terminals at the present time step $t=t_k$.

To derive a system response equation comprising of battery responses defined in equation (6) and input currents, the following equation converts equation (6) to $$v_{2,k} = y_k - R_1 i_k \qquad (7)$$

Then equation (7) is combined with equation (3) resulting in the system dynamics equation expressed by input currents and system responses in the following:

$$y_k = a y_{k-1} + R_1 i_k + (b - a R_1) i_{k-1} \qquad (8)$$

The resulting equation is expressed in a form of a linear function composed with coefficients a, $R_1$, and $(b-aR_1)$, and independent variables. The linear coefficients a, $R_1$, $(b-aR_1)$, and independent variables represent the measured system voltage response $y_{k-1}$ at the previous time step $t=t_{k-1}$, the current input to the battery pack $i_k$ at the present time step $t=t_k$, and the current input to the battery pack $i_{k-1}$ at the previous time step $t=t_{k-1}$.

The coefficients of the linear equation in equation (8) are represented in a 1×3 vector form as the following:

$$\beta = [a\, R_1\, (b-aR_1)]^T = [\beta_1\, \beta_2\, \beta_3]^T \qquad (9)$$

The independent variables of the linear equation in equation (8) are expressed as the following vector:

$$X_k = [y_{k-1}\, i_k\, i_{k-1}] \qquad (10)$$

The coefficient vector $\beta$ is estimated from the dataset(s) which include the measurement data within the sliding window using the following equation:

$$\hat{\beta} = (X^T X)^{-1} X^T y \qquad (11)$$

where $\hat{\beta}$ is the identified coefficient vector, and X is the data matrix of the independent variables. When the number of data in the time window is N, the data matrix X of the independent variables in equation (11) is a N×3 matrix constructed by the following vector:

$$X = \begin{bmatrix} y_{k-N} & i_{k-N+1} & i_{k-N} \\ \vdots & \vdots & \vdots \\ y_{k-1} & i_k & i_{k-1} \end{bmatrix} \qquad (12)$$

A data vector of the dependent variable in equation (11) is a N×1 vector constructed by $$y = \begin{bmatrix} y_{k-N+1} \\ \vdots \\ y_k \end{bmatrix} \qquad (13)$$

Once the coefficient vector $\hat{\beta}$ is identified, the battery model parameters, $R_1$, $R_2$, and C can be computed from the vector using the following equations derived by equations (4), (5), and (9):

$$R_1 = \hat{\beta}_2 \qquad (14)$$

$$R_2 = \frac{\hat{\beta}_3 + \hat{\beta}_1 \hat{\beta}_2}{1 - \hat{\beta}_1} \qquad (15)$$

$$C = \frac{\Delta t}{\hat{\beta}_3 + \hat{\beta}_1 \hat{\beta}_2} \qquad (16)$$

Figure 3:
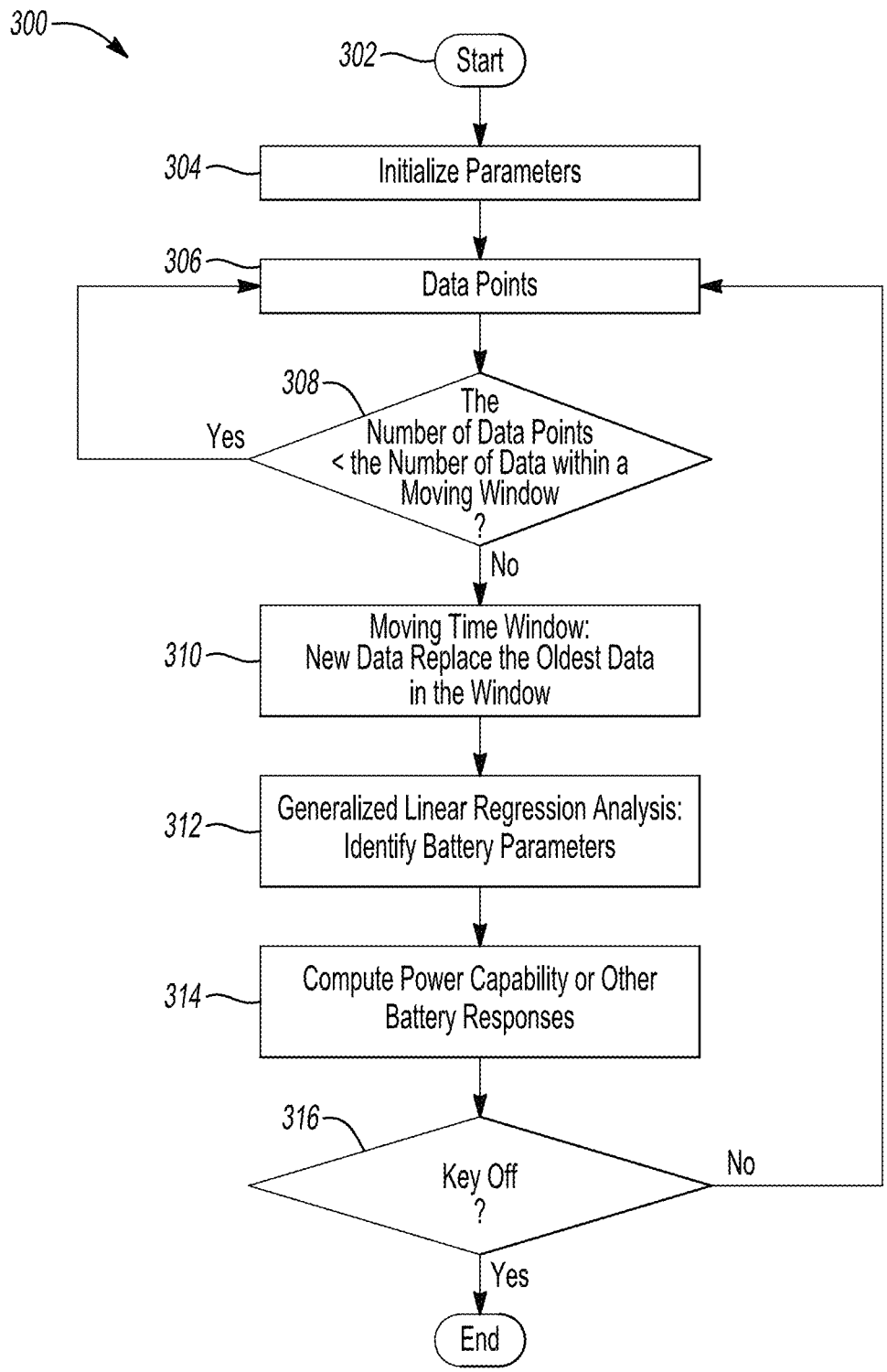
FIG. 3 is a flow chart of an algorithm for identifying one or more battery model parameters.

FIG. 3 is a flow chart of an algorithm for identifying one or more battery model parameters used in the management and control of a battery pack. The method may be implemented using software code contained within the vehicle control module. In other embodiments, the method 300 may be implemented in other vehicle controllers, or distributed amongst multiple vehicle controllers.

Referring again to FIG. 3, the vehicle and its components illustrated in FIG. 1 and FIG. 2 are referenced throughout the discussion of the method to facilitate understanding of various aspects of the present disclosure. The method of controlling the battery parameter prediction in the hybrid electric vehicle may be implemented through a computer algorithm, machine executable code, or software instructions programmed into a suitable programmable logic device(s) of the vehicle, such as the vehicle control module, the hybrid control module, another controller in communication with the vehicle computing system, or a combination thereof. Although the various steps shown in the flowchart diagram 300 appear to occur in a chronological sequence, at least some of the steps may occur in a different order, and some steps may be performed concurrently or not at all.

At step 302, during a key-on event which allows the vehicle to be powered on, the vehicle computing system may begin powering up the one or more modules. The powering up of the one or more modules may cause variables related to the battery management system to initialize before enabling one or more algorithms to be executed within the vehicle computing system at step 304.

For example, the battery parameters may need to be initialized during a key-on event due to the dynamics of a battery cell at rest having a self-discharge/charge depletion state. The battery management method may initialize the system before measuring input current and output voltage for predicting the battery terminal voltage, current limits, and/or other battery related parameters characterizing battery dynamics. The battery dynamics may vary during a key-on event based on several factors including, but not limited to, length of vehicle power down without charge, life of the battery, battery operating modes, and/or environmental conditions.

At 306, the system may receive measured battery voltage outputs and current inputs from sensors in the battery system or algorithms designed to estimate the system responses. The system may monitor the number of data points consisting of current measurements and voltage measurements at step 308. If the number of data points is less than the desired amount of data points measurable in a predetermined moving window, the system may request the collection of additional data points before conducting a generalized linear regression analysis 312. For example, the number of data points within the predetermined sliding window may be calculated by dividing the window duration $t_{dur}$ by the time step $\Delta t$. In another example, the system may collect data points within the moving window until it is equal to or greater than the calibratable number of data points required to calculate battery parameter predictions using the receding horizon analysis. If the system has not received the number of data points required, it may continue to measure and gather more input current and output voltage data.

The duration (or size) of the sliding window may be calibrated based on several factors including the determination of maintaining the discrepancy of the estimated model parameters in relation to the battery parameter value(s) premeasured during offline testing. The discrepancy may be based on a predefined range between the estimated model parameters and the premeasured battery parameter values. The real value(s) may be identified and/or measured off-line using a calibration process. The ranges may be expressed as functions of battery state of charge, temperature, and/or other battery characteristic variables, At step 310, if the number of data points is equal to or greater than the number of data points required in the moving windows, a new data point is added to the data set while the oldest data point is removed from the data set. The time frame window is illustrated and explained in more detail in FIG. 4.

At step 312, once the system has the data comprising of battery voltage and current measurements prepared through steps 306, 308, and 310, the system may conduct a generalized linear regression analysis of the data sets to estimate battery model parameters characterizing battery dynamics in the equivalent circuit model. The generalized linear regression analysis uses a set of data comprising explanatory variables (or independent variables) and response variables (or dependent variables) to estimate the coefficients in the linear regression equation for the best fit of data. The data sets are prepared by recording the current and voltage measurements collected within the sliding window. The battery parameters may be, but are not limited to, the internal battery resistance and the parameters in the R-C circuit in the equivalent circuit 200. The battery parameters may be different based on the structure of the equivalent circuit model used in the battery management method.

At step 314, predicting battery responses, including the battery power capability, allows the system to determine how the battery power and energy are managed at every time step or any time step. The battery power capability may include setting maximum and minimum power limit values for operating the battery based on the calculated impedance. Accurate battery response prediction may prevent or moderate the excessive use of the battery by adjusting battery operation within safe ranges, thus improving the life of the battery. Accurate battery response prediction may also improve the performance of the powertrain system or other related systems/subsystem by extending the usage of the battery pack in the battery electric or hybrid electric vehicle.

If the system detects a key-off event, the system may end the one or more algorithms used to manage the battery pack and/or the one or more battery cells at step 316. If the system does not receive a key-off request, the system may continue to measure battery current and output voltage of the battery pack used to estimate battery parameters. At step 318, the vehicle computing system may have a vehicle key-off mode to allow the system to store one or more parameters in nonvolatile memory such that these parameters may be used by the system for the next key-on event.

Figure 4:
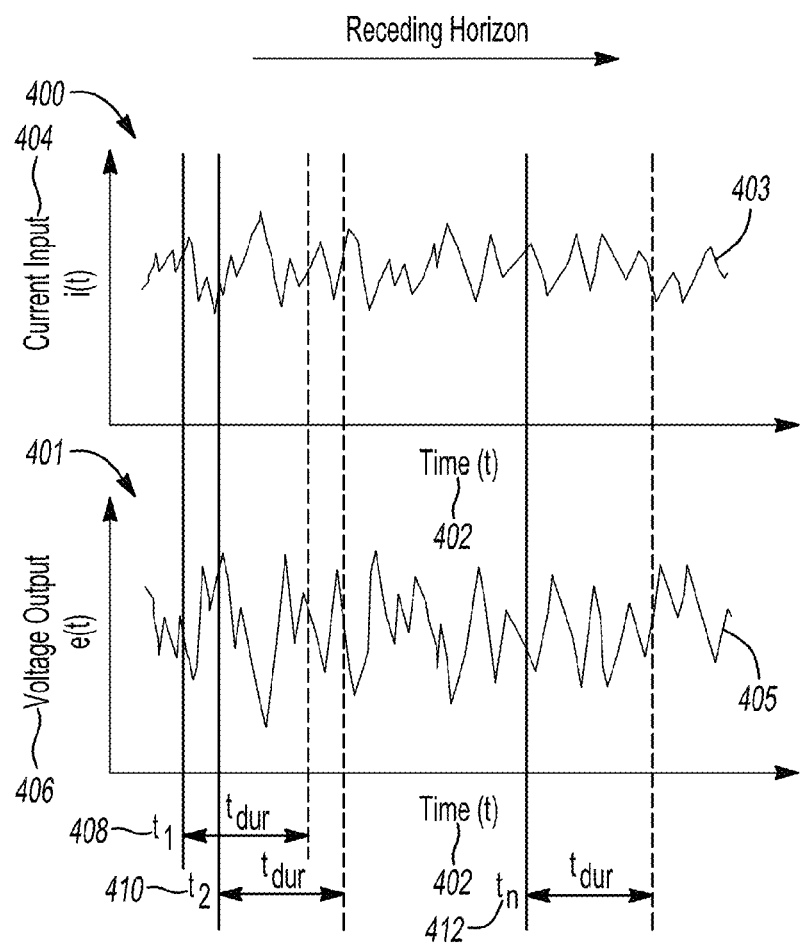
FIG. 4 are graphs illustrating a sliding time window during which battery current input and voltage output data are collected.

FIG. 4 are graphs illustrating the receding horizon statistical regression approach receiving voltage and current data in one or more sliding windows. The graphs display a battery input current profile 403, a battery voltage output profile 405, and moving windows with the duration of $t_{dur}$ at different time locations 408, 410, 412. The battery input current profile graph 400 consists of an x-axis representing time 402, a y-axis representing current 404, and a battery input current profile 403. The battery voltage output profile graph 401 consists of an x-axis representing time 402, a y-axis representing current 406, and a battery output voltage profile 403. The current profile 403 and the voltage profile 405 may be measured by sensors or estimated by various algorithms.

The receding horizon (or moving window) allows real time estimation of one or more battery model parameters while using only the amount of battery response data stored in the moving window within the time duration $t_{dur}$. The general linearized regression analysis of the collected data 403, 405 in the moving windows 408, 410, 412 filters the measurement noises and processes the noises in the data by minimizing the discrepancies between the data and a regression equation. The window time duration $t_{dur}$ is determined with the balance of the noise rejection performance and the real parameter value tracking performance.

Figure 5:
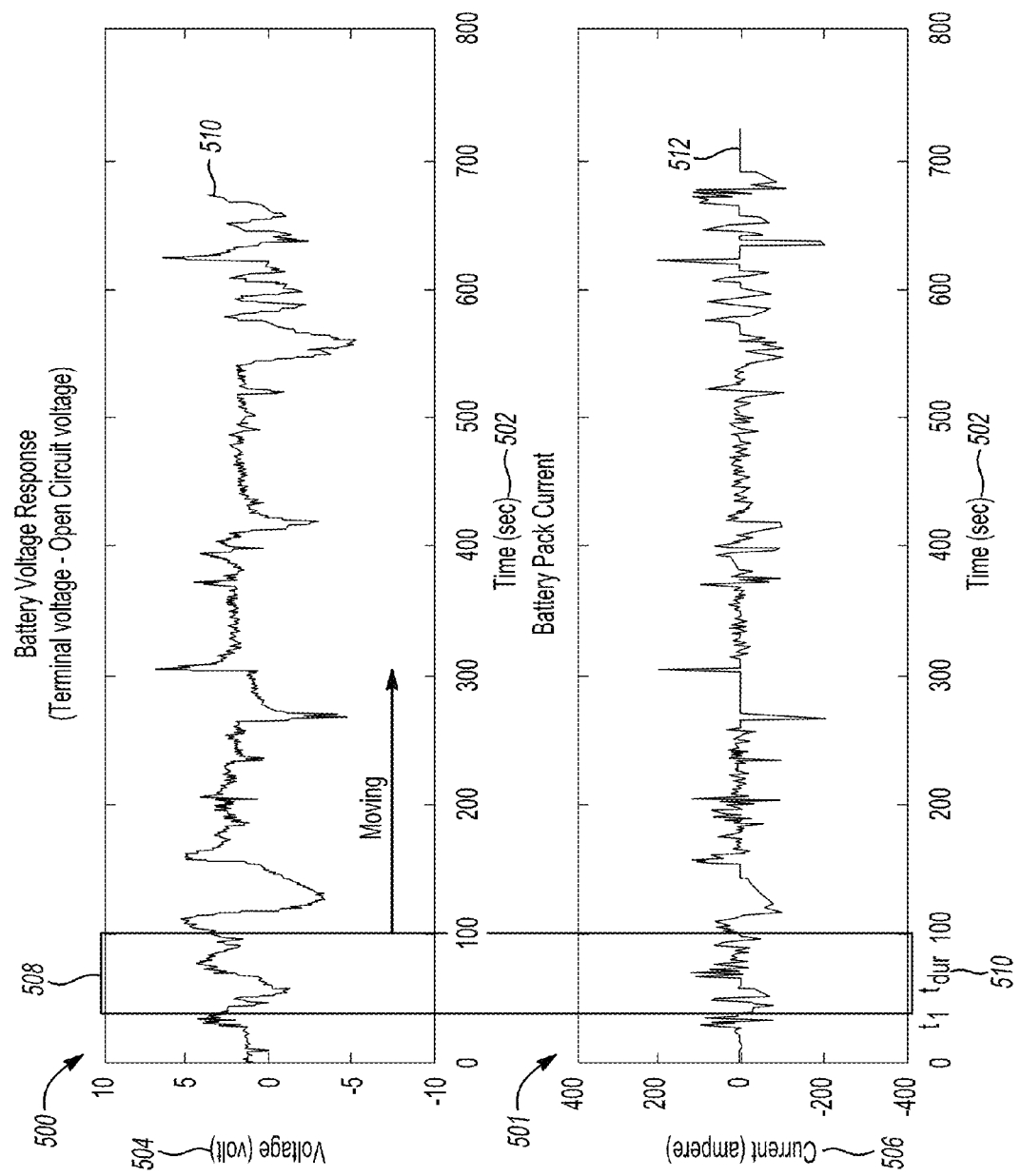
FIG. 5 are graphs illustrating measured battery current and voltage data used in generalized regression analysis.

FIG. 5 are graphs showing measurement data of battery current and voltage which are used to construct independent variable data and dependent variable data in the generalized linear regression analysis. The graphs display a moving window 508 to collect the measurement data of the battery current and voltage. The battery voltage output profile graph 500 displays the battery voltage output 510 computed by the battery terminal voltage minus the battery open circuit voltage (OCV). The battery voltage output profile 500 consists of an x-axis representing time 502 and a y-axis representing voltage 504. The battery input current profile graph 501 displays the battery input current 512 by having an x-axis representing time 502 and a y-axis representing current 506. The window, having a predefined duration of time step 510 and moving towards new data, collects a new data point of battery current and voltage at the present time and abandons the oldest data point in the window.

Figure 6:
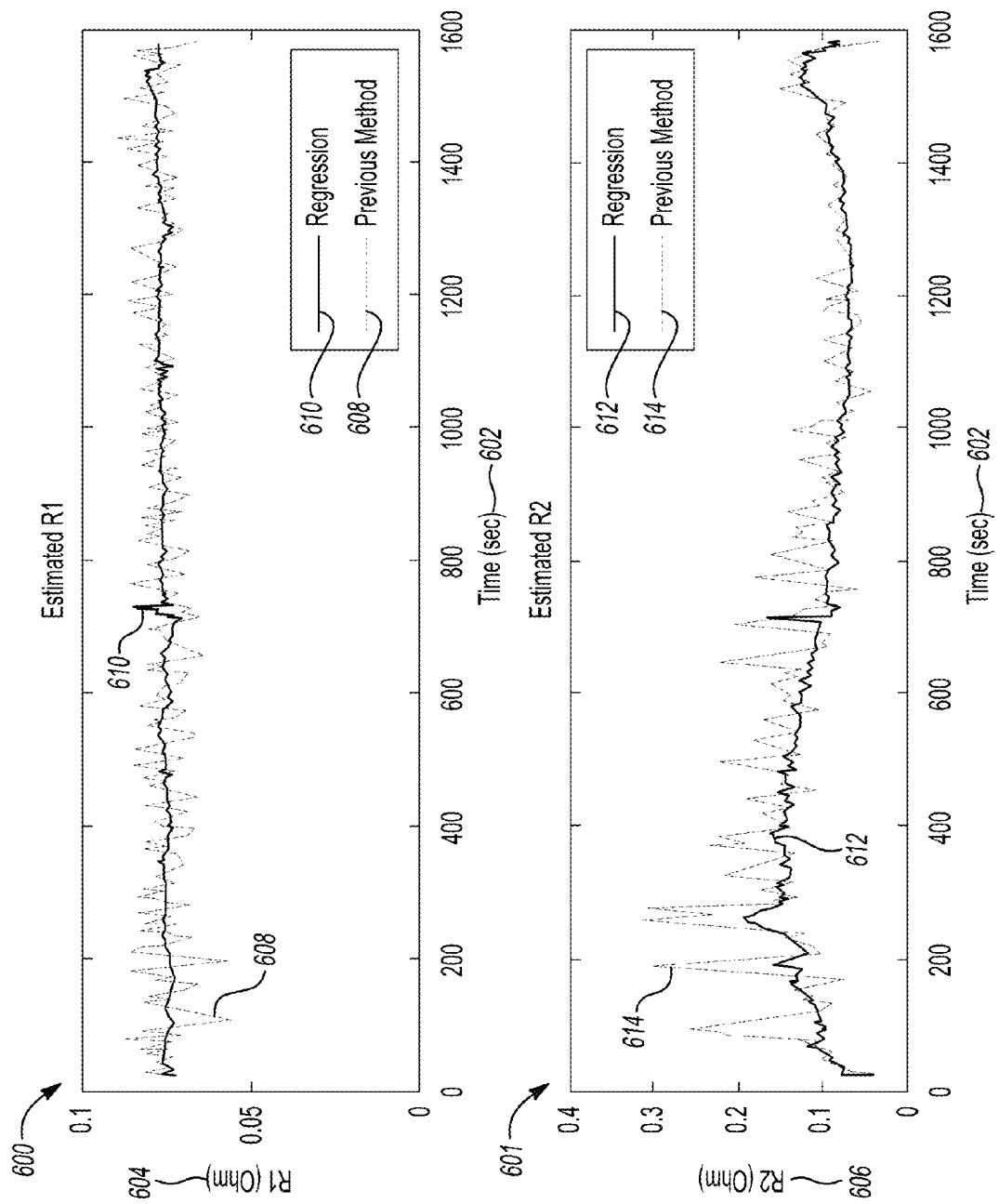
FIG. 6 are graphs illustrating estimated battery parameters generated from the receding horizon statistical regression approach.

FIG. 6 are graphs illustrating estimated battery parameters using the receding horizon statistical regression approach. The internal resistance (or, active electrolyte resistance) profile graph 600 displays the estimation results of the internal resistance along a time period using the receding horizon method 610 and a previous method 608. The previous method 608 may include, but is not limited to, an extended Kalman filter estimation approach. The graph 600 consists of an x-axis representing time 602, a y-axis representing ohms 604, and the estimated profiles of the internal resistance 608, 610. The active charge transfer resistance profile graph 601 displays the estimated profiles of the charge transfer resistance using the regression analysis 612 and a previous method 614, which may be realized, but not limited to, using an extended Kalman filter. The charge transfer resistance profile graph consists of an x-axis representing time 602 and a y-axis representing ohms 606.

The estimated battery model parameters may include, but are not limited to, the internal resistance $R_1$, the charge transfer resistance $R_2$, and charge transfer capacitance C, and allow the battery controller to calculate (or predict) battery power capabilities or other battery responses in real time. The calculated battery model responses help to effectively use the battery pack while preventing battery excessive operations beyond the battery usage limits, thus improving the life and performance of the battery pack and/or the one or more battery cells.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:
1. A vehicle comprising:
a traction battery; and
a controller configured to
output impedance parameters associated with the battery based on regressions of battery input current data and corresponding battery output voltage data falling within a sliding window having a temporal size;

output a power capability for the battery defining maximum and minimum power limits based on the impedance parameters; and operate the battery to maintain power associated with the battery within the limits.

2. The vehicle of claim 1, wherein the temporal size is based on a difference between a predefined value and a value of at least one of the impedance parameters.

3. The vehicle of claim 2, wherein the temporal size increases as the difference increases.

4. The vehicle of claim 2, wherein the temporal size decreases as the difference decreases.

5. The vehicle of claim 1, wherein the impedance parameters include internal resistance, charge transfer resistance, or charge transfer capacitance.

6. A traction battery system comprising:
a plurality of cells; and
a controller configured to
    implement a sliding window having a temporal size to filter input current data and corresponding output voltage data associated with the cells;
    output impedance parameters associated with the cells based on regressions of the input current data and corresponding output voltage data;
    alter the temporal size based on a difference between a value of at least one of the impedance parameters and a predefined value such that subsequent values of the at least one of the impedance parameters fall within a predefined range about the predefined value;
    output a power capability for the cells defining maximum and minimum power limits based on the impedance parameters; and
    charge and discharge the cells such that power associated therewith remains within the limits.

7. The system of claim 6, wherein the temporal size increases as the difference increases.

8. The system of claim 6, wherein the temporal size decreases as the difference decreases.

9. The system of claim 6, wherein the impedance parameters include internal resistance, charge transfer resistance, or charge transfer capacitance.

10. A control method comprising:
    outputting impedance parameters of a traction battery based on regressions of battery input current data and corresponding battery output voltage data falling within a sliding window having a temporal size;
    outputting a power capability for the battery defining maximum and minimum power limits based on the impedance parameters; and
    operating the battery to maintain power associated with the battery within the limits.

11. The method of claim 10, wherein the temporal size is based on a difference between a predefined value and a value of at least one of the impedance parameters.

12. The method of claim 11, wherein the temporal size increases as the difference increases.

13. The method of claim 11, wherein the temporal size decreases as the difference decreases.

14. The method of claim 10, wherein the impedance parameters include internal resistance, charge transfer resistance, or charge transfer capacitance.

15. The method of claim 10, wherein the regressions are linear regressions.

* * * * *